(12) United States Patent
Kogasumi

(10) Patent No.: US 8,502,550 B2
(45) Date of Patent: Aug. 6, 2013

(54) OPERATION CONTROL STRUCTURE FOR A CONTINUITY TEST DEVICE

(75) Inventor: Kozo Kogasumi, Makinohara (JP)

(73) Assignee: Yazaki Corporation, Tokyo (JP)

( * ) Notice: Subject to any disclaimer, the term of this patent is extended or adjusted under 35 U.S.C. 154(b) by 209 days.

(21) Appl. No.: 13/137,009

(22) Filed: Jul. 15, 2011

(65) Prior Publication Data

US 2012/0019276 A1   Jan. 26, 2012

(30) Foreign Application Priority Data

Jul. 22, 2010 (JP) ................................. 2010-164787

(51) Int. Cl.
*G01R 31/20* (2006.01)
*H01R 29/00* (2006.01)

(52) U.S. Cl.
USPC .................. 324/755.01; 324/754.12; 439/169

(58) Field of Classification Search
USPC ............. 324/754.03, 754.12–754.16, 755.01, 324/755.04–755.06, 757, 757.02; 439/169, 439/218–219, 482, 583
See application file for complete search history.

(56) References Cited

U.S. PATENT DOCUMENTS

| | | | |
|---|---|---|---|
| 5,498,966 A * | 3/1996 | Yamamoto | 324/538 |
| 2006/0249340 A1 | 11/2006 | Love | |
| 2009/0120748 A1 | 5/2009 | Love | |

FOREIGN PATENT DOCUMENTS

| | | |
|---|---|---|
| EP | 0649028 A1 | 4/1995 |
| EP | 0775916 A1 | 5/1997 |
| JP | 05-288793 A | 11/1993 |
| JP | 2007-085926 A | 4/2007 |
| JP | 2008-542633 A | 11/2008 |

OTHER PUBLICATIONS

Office Action dated Apr. 23, 2012, issued for the corresponding Portuguese patent application No. 105822 and English summary thereof.

* cited by examiner

*Primary Examiner* — Melissa Koval
*Assistant Examiner* — Farhana Hoque
(74) *Attorney, Agent, or Firm* — Edwards Wildman Palmer LLP

(57) ABSTRACT

There is provided an operation control structure for a continuity test device for performing lock of a connector and actuation of a continuity test part timely, low cost, easily, and surely including a connector attachment part 3, a continuity test part 4 having a probe pin 12, a first cylinder 16 for locking a connector 10 in the connector attachment part, a second cylinder 15 for moving the continuity test part to the connector attachment part, wherein plugs 30 and 54 of the first cylinder and the second cylinder respectively are supplied with the same pressured air, a speed control valve 26 being provided within a plug 30 of the second cylinder 15, a fine hole 28 thinner than a hole 56 in a plug 54 of the first cylinder being provided in the speed control valve, and wherein the continuity test part is actuated by the second cylinder through the fine hole following lock of the connector by the first cylinder. A hole 37 for air discharge is provided in the speed control valve 26 is connected to a hole 31 of the plug via a gap 38 between the outer circumference of the speed control valve and the inner circumference of the plug 30 of the second cylinder 15, and wherein a test valve 36 is provided in the gap.

2 Claims, 2 Drawing Sheets

OPERATION CONTROL STRUCTURE FOR A CONTINUITY TEST DEVICE

CROSS REFERENCE TO RELATED APPLICATIONS

This application is on the basis of Japanese Patent Application NO. 2010-164787, the contents of which are hereby incorporated by reference.

BACKGROUND OF THE INVENTION

1. Field of the Invention

The present invention relates to an operation control structure for a continuity test device for locking a connector and actuating a continuity test part timely in a continuity test device for continuity test of a wire harness.

2. Description of the Related Art

A conventional continuity test device is described in, e.g., the Patent Document 1, in which a connector of a wire harness is attached to a connector attachment part horizontally and fixed not to exit by a lock click of an arm, and then the operator rotates a lever to move the continuity test part horizontally to the connector, and a probe pin of the continuity test part is further contacted to a pin in the connector, which enable an electric wire with a pin and an electric wire of the probe pin to configure a closed loop circuit so as to test continuity.

In the Patent Document 2 is also described that a connector of a wire harness is attached perpendicularly to a connector attachment part, while a continuity test part having a vertical probe pin is lifted by a vertical cylinder, a pair of links is closed by a tapered surface of the continuity test part, and the connector is thus fixed to the connector attachment part not to exit by a lock piece integrated with the link.

That impact force is distributed by a plurality of flow controllers not for a continuity test but for controlling a cylinder pressure is described in, e.g., the Patent Document 3, in which.

[Patent Document 1] JP, A, H5-288793 (FIGS. 5 and 6)
[Patent Document 2] JP, A, 2007-85926 (FIG. 6)
[Patent Document 3] JP, A, 2008-542633 (FIG. 3)

However, in the above conventional continuity test device, there is anxiety of an operation failure and the like that is accompanied by growing burden of the operator and wearing of the link because an operation for locking a connector to a connector attachment part is performed manually or a sequential mechanical operation for a continuity test part.

Although a method for locking a connector and actuating a continuity test part by each corresponding cylinder has been approached, it is, in this case, necessary to control a timing of locking a connector and actuating the continuity test part, and in a case of controlling a flow by, e.g., a commercially available speed controller, the parts cost is run up while much man-hour cost for adjusting a timing of operation every continuity test has been required. Note that actuating the continuity test part with lock of a connector incomplete causes a probe pin of the continuity test part to extrude the connector from the continuity test part, resulting in a failure of the continuity test.

Accordingly, considering the above problems, an object of the present invention is to provide a continuity test structure for a continuity test device for locking a connector and actuating a continuity test part timely, at low cost, easily and surely.

SUMMARY OF THE INVENTION

To achieve the above object, there is provided an operation control structure for a continuity test device according to the present invention recited in claim 1, including a connector attachment part, a continuity test part having a probe pin, a first cylinder for locking a connector in the connector attachment part, a second cylinder for moving the continuity test part to the connector attachment part, wherein the first cylinder and the second cylinder are supplied with an air of the same air pressure, a speed control valve being provided within a plug of the second cylinder, a fine hole much thinner than a hole in a plug of the first cylinder being provided in the speed control valve, and wherein the continuity test part is actuated by the second cylinder through the fine hole following lock of the connector by the first cylinder.

According to the above structure, the plug of the first and the second cylinder (an air injection part) is supplied respectively with an air with the same pressure, and a flow of the air is valved by the fine hole of the speed control valve in the plug of the second cylinder while the first cylinder is loaded with the same pressure as the supply pressure, the first cylinder is thus driven earlier than the second cylinder so that the connector is locked, and then the second cylinder is driven later, and the continuity test part is driven after lock of the connector so that a probe pin (a continuity pin) contacts a pin in the connector. Thus, lock of the connector and actuation of the continuity test are performed timely at slightly different time. The speed control valve of the second cylinder has no need for replacement or adjustment every continuity test, i.e., a fixed type.

There is provided an operation control structure for a continuity test device according to the present invention recited in claim 2, the operation control structure for a continuity test device as claimed in claim 1 further including, a hole for air discharge being provided in the speed control valve in a radial direction, wherein the hole for air discharge is connected to a hole of the plug via a gap between the outer circumference of the speed control valve and the inner circumference of the plug of the second cylinder, and wherein a test valve is provided in the gap.

According to the above structure, because an air discharge from the fine hole of the speed control valve leaves the air discharge slow so that a return move of the second cylinder (a move for returning the continuity test part in the adverse direction of the connector) may be delayed, an air discharge can be performed via other channel. Namely, an effective air discharge passing from a hole for air discharge through a gap of the outer circumferential of the valve, through the valve between the hole for air discharge and a hole of the plug, and out of a hole of the plug allows the return move of the second cylinder smooth and rapid.

Advantageous Effects Of Invention

According to the invention recited in claim 1, no need for adjustment and the like for operation timing every continuity test, compared to a flow control for the cylinder of the continuity test being performed utilizing, e.g., a commercially available speed controller requires no man-hour for setup, further decrease the parts cost for the speed control valve, and in addition allows lock of the connector and actuation of the continuity test to be performed timely, easily and surely so as to test the continuity of the connector smoothly and rapidly.

According to the invention recited in claim 2, an air discharge of the air of the second cylinder after continuity test of the connector not via the fine hole of the speed control valve but via other channel allows the second cylinder to be returned smoothly and rapidly and new continuity test of the connector to be performed rapidly.

DETAILED DESCRIPTION OF THE PREFERRED EMBODIMENTS

Figure 1:
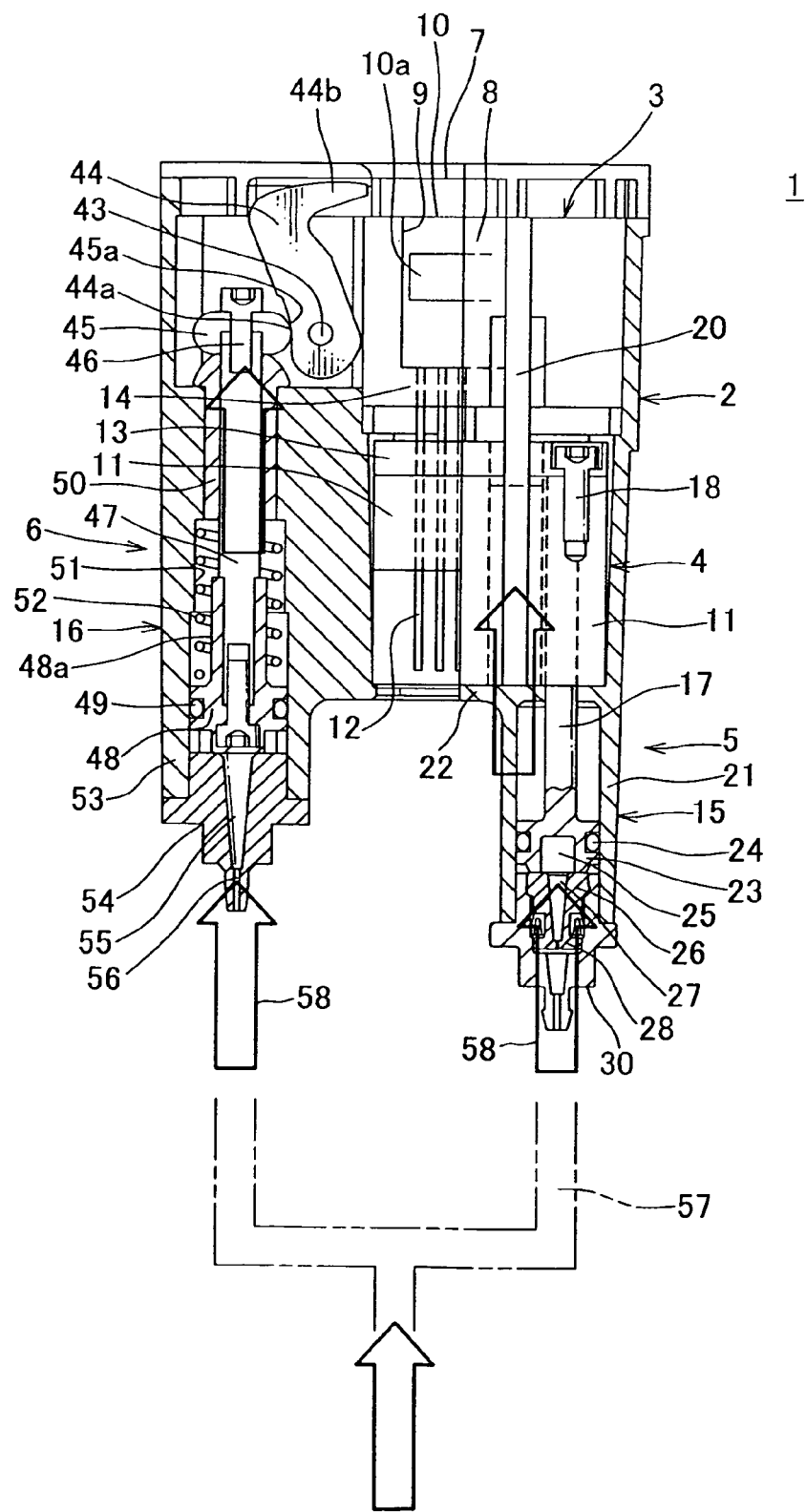
FIG. 1 is a vertical cross sectional view illustrating one embodiment of an operation control structure for a continuity test device according to the invention.
Figure 2:
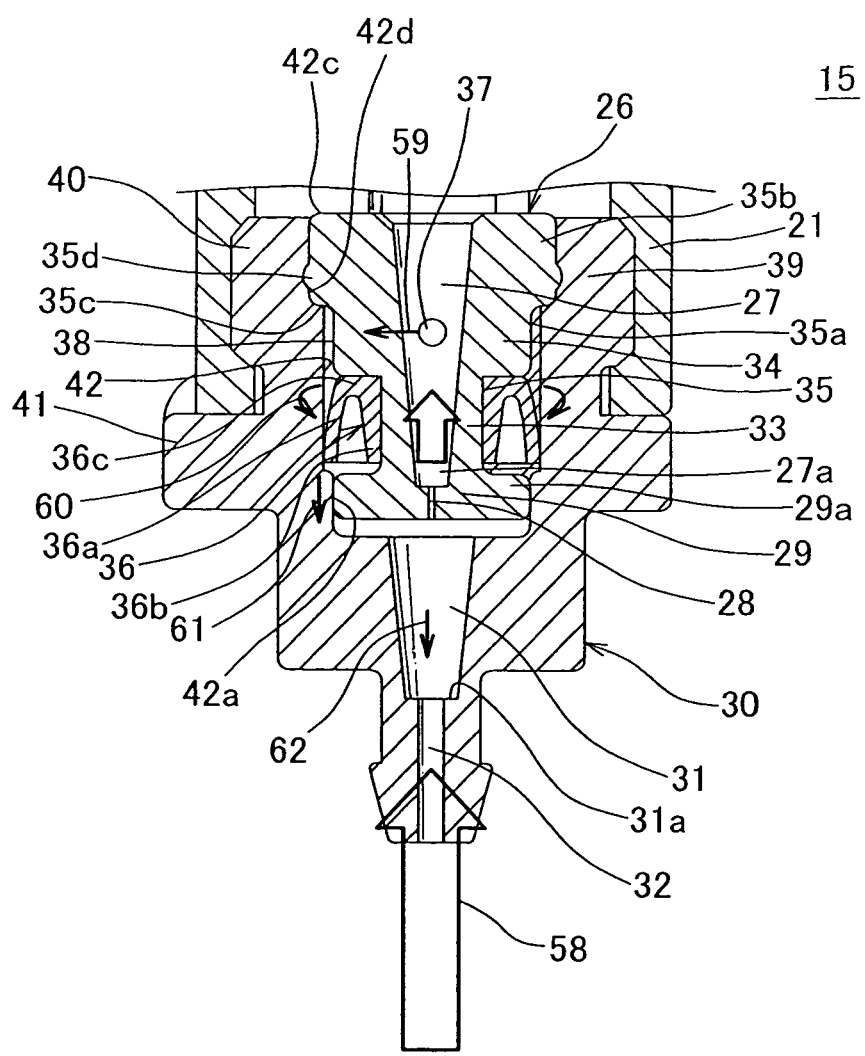
FIG. 2 is a vertical cross sectional view illustrating main part of an air cylinder for actuating a continuity test part of the continuity test device according to the invention.

FIGS. 1 and 2 illustrate one embodiment of an operation control structure for a continuity test device according to the invention.

As shown in FIG. 1, a continuity test device 1 includes a case 2 made of synthetic resin or metal, a connector attachment part 3 arranged and accommodated behind in the upside of the case 2, a continuity test part 4 arranged and accommodated movable up and down in the downside of the connector attachment part 3 and behind in the middle of the case 2, an actuator 5 arranged and accommodated below the continuity test part 4 and behind in the downside of the case 2 including an air cylinder 15 (a second cylinder), and a connector lock mechanical part 6 including an air cylinder 16 (a first cylinder) arranged in the front side of the case 2. The front, behind, left or right direction herein is for convenience of explanation.

An opening 7 is provided at the right upper end of the case 2, and the connector attachment part 3 is located below the opening 7. The connector attachment part 3 is fixed to the case 2 and includes a connector insert hole 9 downward from a top end of a block 8 made of isolative synthetic resin, and a connector 10 of a wire harness is installed downward (vertical) from above the opening 7 into the insert hole 9 (only front part of the connector 10 is shown).

A plurality of pins (not shown) is accommodated downward in the connector 10 (connector housing made of isolative synthetic resin), and an electric wire (not shown) connected to each of the pins is derived out of the opening 7, which configures a part of an electric wire of the ware harness. The symbol 10a of the connector 10 shows a side spacer for double locking for the pin.

The continuity part 4 includes a plurality of probe pin 12 (continuity pin) made of conductive metal penetrating upward a block 11 made of isolative synthetic resin, the probe pin 12 is fixed penetrating to above an horizontal block plate 13 made of isolative synthetic resin, and the upper end part of the probe pin passes through a hole of a bottom wall 14 of the connector attachment part 3, penetrating into below an opening of a pin housing chamber of connector 10 (an insert opening for a mating connector pin), then contacting a lower end part of a pin in the pin housing chamber. The block plate 13 is movable up and down together with the probe pin 12 in the vertical air cylinder 15 (the second cylinder) of the actuator 5.

The block 11 is fixed to the block plate 13 by a bolt 18, and the block plate 13 and the block 11 are positioned slidable and engaged with a vertical guide pin 20 fixed to the connector attachment part 3. A tube potion 21 (a tube wall) of the air cylinder 15 is provided integrally at the bottom 22 of the case 2, a piston 23 is engaged movable up and down (slidable) below the tube part 21, and a rod part (substituted by a symbol 17) of the piston rod 17 extends upward from the piston 23.

The piston 23 has a packing 24 on the outer circumference and an empty chamber 25 opening upward in the middle of a lower end surface.

The speed control valve 26 made of metal or synthetic resin is arranged below the piston 23, the lower end part of the piston 23 contacts the upper end surface of the speed control valve 26 as shown in FIG. 1, and the empty chamber 25 is connected to a vertical tapered (or straight) hole 27 of the speed control valve 26.

As shown in FIG. 2, the speed control valve 26 has a vertical fine short hole 28 connected to the tapered hole 27 at the bottom wall 29. The fine hole 28 is connected to a vertical tapered (or straight) hole 31 of a plug 30 made of metal or synthetic resin, and the hole 31 is connected to the outside via a downward vertical straight small-diameter hole 32. The fine hole 28 is formed much thinner than the holes 27, 31, and 32.

Each of the holes 27 and 31 is formed to be contracted radially as approaching downward, and the inner diameters of the both holes 27 and 31 are comparable. A bottom part 27a in the vertical section of the hole 27 of the speed control valve 26 is formed generally semicircle, in the middle of which a fine hole 28 opens downward. A straight hole 32 thinner than the hole 31 in the middle of the bottom surface 31a of the hole 31 of the plug 30 opens.

The tapered hole 27 of the speed control valve 26 is longer than the hole 31 of the plug 30, and the length that those of the holes 31 and 32 of the plug 30 are combined is comparable to the length that those of the speed control valve, i.e., the length of the hole 27 and the short fine hole 28 are combined. The inner diameter of the fine hole 28 is comparable to, e.g., a fifth of the straight hole 32 of the plug 30 or an eighth of the minimum diameter (a part shown by the symbol 27a) of the bottom side of the hole 27 of the speed control valve 26, and the length of the fine hole 28 is comparable to an eighth of the hole 27 of the speed control valve 26. Each of the holes 27, 28, 31 and 32 in the horizontal section is formed circular.

The bottom wall 29 of the speed control valve 26 has a circular-plate-shaped flange 29a projecting outward in the radial direction, and a small-diameter tube wall part 33 stands from the bottom wall 29a so as to be connected to a large-diameter annular wall 34 above the tube wall part 33. An annular slit 35 is provided between the outer circumference of the tube wall part 33, i.e., the flange 29a and a horizontal lower surface of the annular wall 34, and a test valve 36 made of, e.g., synthetic rubber is mounted in the annular slit 35.

The annular wall 34 is composed of a small-diameter part 35a, the lower half, and a large-diameter part 36b, the upper half, and the small-diameter part 35a is connected to the large-diameter part 35b through a step part 35c, and a projection 35d for fixing is provided on the lower outer circumference of the large-diameter part 35b. A horizontal circular hole 37 for air discharge is provided in the small-diameter part 35a in the radial direction, and the hole 37 (horizontal hole) connects the hole 27 and a gap between the hole 27 and the outer circumference side of the small-diameter part 35a. The inner diameter of the hole 37 is generally five times as large as that of the fine hole 28.

The annular wall 39 of the upper half of the plug 30 is threaded airtight by a male-female thread part 40 in the tube part 21 of the cylinder 15, a flange 41 of the middle of the outer circumference of the plug 30 contacts airtightly the lower end surface of the tube part 21, and the speed control valve 26 is accommodated in the large-diameter part 42 that is annular in the cross section and is connected to the upside of the hole 31 of the plug 30 in the inside of the annular wall 39.

The flange 29a is engaged with a rather small-diameter hole 42a on the bottom side of a large-diameter hole 42, a tip part of a tapered lip 36a of the outer circumference of the test valve 36 closely contacts a middle-diameter hole part (substituted as the symbol 42) in the middle of a large-diameter hole 42, a gap 38 is formed between the inner circumference surface of the middle-diameter hole part 42 in the upside of the lip 36a and the outer circumference surface of the small-diameter annular wall 35a in the downside of the speed control valve 26, and the projection 35d on the outer circumference of the annular wall 35b in the upside of the speed control valve 26 is pressed into and fixed to a circumferential slit 42d of the large-diameter hole 42c in the upside of the large-diameter hole 42.

An inner circumference part 36b of the test valve 36 closely contacts the outer circumference surface of the tube part 33, an upper wall part 36c connected to the inner circumference part 36b closely contacts the lower surface of the annular wall 35, the outside lip 36a connected to an upper wall part 36c strongly and closely contacts the inner circumference surface of the hole 42 by air pressure from underneath, which leads radial contradiction inward by air pressure from above to form a gap between the inner circumference surface of the hole 42 and itself. There is a certain gap between the outer circumference surface of the flange 29a and inner circumference surface of the small-diameter hole 42a.

The tube part 21 of the cylinder 15 in FIG. 1, a piston rod 17 (including a piston 23), the speed control valve 26, the test valve 36 (FIG. 2) and the plug 30 compose the actuator 5 for moving up and down the continuity test part 4. Though the present embodiment shows only one of cylinder 15 of the actuator 5, it is preferable for the actuator 5 to use two right and left cylinders 15 practically. A cylinder 16 of a lock mechanical part 6 is one. The cylinder includes a piston rod, and cylinder body is a wall of the outer circumference of the cylinder.

As shown in FIG. 1, a connector lock mechanical part 6 accommodated in front half of the case 2 is composed of a lock click 44 made of metal or synthetic resin provided rotatively above the case 2 by a horizontal shaft 43, a ring 45 having circular arc surface 45a contacting slidably a bent outer surface in front side of the lock click 44 and rotating the lock click 44 in the lock or unlock direction, a vertical piston rod 47 to which the ring 46 fixed in the upside thereof by a bolt 46, a piston 48 made of synthetic resin provided in the downside of the piston rod 47 and having a packing 49 in the outer circumference of the upper side of the piston rod 47, a guide tube 50 made of synthetic resin guiding the outer circumference upside the piston rod 47, a compressed coil spring 52 (spring member) biasing downward the piston 48 at a large-diameter hole part (substituted by the symbol 51) in the downside of a vertical piston rod housing hole 51 of the case 2, a plug 54 fixed to the lower part of the tube part 53 of a cylinder body integratedly with the case 2 by thread fastening and contacting the lower surface of the piston 48 onto the upper surface thereof. The piston rod 47, the cylinder body 53 and the plug 54 are necessary to compose the air cylinder 16 (a first cylinder).

The lock click 44 has a backward click 44b in the upside and a bent surface 44a in the lower front side. The ring 45 contacts in the lower half of the bent surface 44a at the position of the piston rod 47 descending in FIG. 1, rotates the click 44b frontward to be unlocked, and ascent of the piston rod 47 leads the ring 45 to contact the upper part of the bent surface 44a and the click 44b to rotate backward, which leads the upper surface of the connector 10 to be locked. The piston 48 has a extended tube part 48a along the rod (substituted by the symbol 47), and the upper end of the extended tube part 48a contacts the middle step of the hole 51 of the case 2, which prevents the piston rod 47 from ascending farther.

The plug 54 is slightly larger than the plug 30 of the actuator 5, and has a tapered-shape hole 55 diameter of which is contradicted as approaching the lower end from the top end thereof, a short straight small-diameter hole 56 connected to lower side of the hole 55. The inner diameter of the fine hole 28 of the speed control valve 26 near the actuator 5 is so much small as is as small as or smaller than a fifth of the diameter of the hole 56. The maximum diameter of the top end of the hole 27 of the speed control valve 26 is smaller than that of the top end of the hole 55.

Hereafter, the function of the operation control structure of the above continuity test device 1 (the method of operation control) is described.

First, the same pressured air is supplied simultaneously to each straight hole 32 and 56 of the downside of the plug 54 of the cylinder 16 of the lock mechanical part 6 and the plug 30 of the cylinder 15 of the actuator 5, respectively, as shown by the arrow 58 via an air supply tube 57 which is branched into two shown in FIG. 1.

The speed control valve is embedded in the plug 30 on the side of the actuator, and an air supply is throttled by a fine and fixed hole 28 of the speed control valve 26 to decrease a supply air flow into the cylinder 15. Whereas, because the holes 55 and 56 of which diameter is much larger than the fine hole 28 is formed in the plug 54 on the side of the lock mechanical part 6, an air supply is not throttled by the plug 54. The piston rod 47 of the cylinder 16 of the actuator 6 thus ascends forward, and the ring 45 of the upper end of the piston rod 47 rotates backward the lock click 44 to lock the connector 10.

Following lock of the connector 10, the piston rod 17 of the cylinder 15 on the side of the actuator 5 ascends, and the block plate 13 of the continuity test part 4 ascends together with the probe pin 12. The probe pin 12 contacts the tip (lower end) of the pin of the connector 10 in the connector attachment part 3, and then a closed loop circuit is configured by an electric wire (not shown) connected to the probe pin 12 and an electric wire (not shown) connected to the pin via a controller of the continuity test device (not shown) to test continuity, which indicates "OK" (in case of open circuit, indicates "NG").

An air within the cylinder 15 is discharged by a spring force of a spring (not shown) (in case of single actuated cylinder). There is a spring member 52 of the lock mechanical part 5 or a return spring of the continuity test part 5 (not shown) or the like as a spring member. When the air is discharged via the fine hole 28 of the speed control valve 26, lack of the spring force causes slowing an air discharge, resulting in the need of another channel for air discharge.

As a channel for an air discharge, an air flows from a horizontal hole 37 of the speed control valve 26 in FIG. 2 into the outer circumference of the speed control valve 26 as shown by the arrow 59 in FIG. 2, comes around the lip part 36a of the test valve 36 as shown by the arrow 60, an inward deflection of the lip 36a by an air pressure produces a gap in an outer circumference of the lip part 36a, and the air passes through a gap in the flange 29a as shown by the arrow 61, being discharged into the air source as shown by the arrow 62. Because the air is thus discharged in sequence, an air discharge (return to the cylinder 15) is not delayed, leading a continuity test of a new connector (10) to be effectively performed sequentially in short cycle time. When supplying an air as shown by the arrow 58, the test valve 36 prevents an air from being supplied from the outer circumference (prevention of return).

Note that though, in the above embodiment, the connector 10 is locked by the top end surface of the connector 10 being locked by the lock click 10, it is also possible to lock a recess in the middle of the connector 10 or so. Further, it is possible to lock the connector 10 by a link mechanical part or so actuated by the cylinder 16 instead of the hook-shaped lock click 44.

Furthermore, the structure of the above embodiment is effective for the continuity test device 1 itself or the method of operation control of the continuity test device other than the operation control structure for the continuity test device.

The operation control structure for the continuity test device according to the present invention can be applied, e.g., for performing lock of the connector and actuation of the continuity test part timely in the continuity test device for testing continuity of connector of harness.

What is claimed is:

1. An operation control structure for a continuity test device comprising:
 a connector attachment part;
 a continuity test part having a probe pin;
 a first cylinder for locking a connector in the connector attachment part;
 a second cylinder for moving the continuity test part to the connector attachment part, wherein each of the first cylinder and the second cylinder is supplied with an air of the same air pressure; and
 a speed control valve provided in a plug of the second cylinder, wherein the speed control valve is provided with a fine hole arranged smaller than a hole of a plug of the first cylinder,
 wherein the continuity test part is actuated by the second cylinder through the fine hole following lock of the connector by the first cylinder.

2. The operation control structure for a continuity test device as claimed in claim 1, wherein a hole for air discharge is provided in the speed control valve in a radial direction, wherein the hole for air discharge is connected to a hole of the plug of the second cylinder via a gap between the outer circumference of the speed control valve and the inner circumference of the plug of the second cylinder, and wherein a test valve is provided in the gap.

\* \* \* \* \*